(12) United States Patent
Matsubayashi (10) Patent No.: US 7,852,241 B2
(45) Date of Patent: Dec. 14, 2010

(54) DEMODULATING APPARATUS, DEMODULATING METHOD, AND COMPUTER-READABLE MEDIUM

(75) Inventor: Kei Matsubayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 957 days.

(21) Appl. No.: 11/704,923

(22) Filed: Feb. 12, 2007

(65) Prior Publication Data

US 2007/0222649 A1    Sep. 27, 2007

(30) Foreign Application Priority Data

Feb. 13, 2006  (JP)  ............................ P2006-034760

(51) Int. Cl.
*H03M 7/00* (2006.01)
(52) U.S. Cl. ......................................... 341/81; 375/326
(58) Field of Classification Search .................... 341/81
See application file for complete search history.

(56) References Cited

U.S. PATENT DOCUMENTS

| | | | | |
|---|---|---|---|---|
| 6,151,296 A | * | 11/2000 | Vijayan et al. | 370/208 |
| 6,748,033 B1 | * | 6/2004 | Shiraishi et al. | 375/340 |
| 7,447,277 B2 | * | 11/2008 | Yajima et al. | 375/326 |
| 7,620,111 B2 | * | 11/2009 | Palin et al. | 375/260 |
| 2002/0159410 A1 | | 10/2002 | Odenwalder et al. | |

FOREIGN PATENT DOCUMENTS

| | | |
|---|---|---|
| JP | 8-242215 | 9/1996 |
| JP | 2001-136497 | 5/2001 |
| JP | 2003-51795 | 2/2003 |
| JP | 2003-60610 | 2/2003 |
| JP | 2003-87140 | 3/2003 |
| JP | 3462054 | 8/2003 |
| JP | 2004-214735 | 7/2004 |
| JP | 2004-536496 | 12/2004 |
| JP | 2005-318374 | 11/2005 |
| WO | WO 2005/109713 A1 | 11/2005 |

* cited by examiner

*Primary Examiner*—Khai M Nguyen
(74) *Attorney, Agent, or Firm*—Finnegan, Henderson, Farabow, Garrett & Dunner, LLC (57) ABSTRACT

A demodulating apparatus includes a deinterleave processing unit applying deinterleave processing to supplied data for each of parameters necessary in executing deinterleave processing in a time direction, an acquiring unit acquiring parameters with which the data should be processed, and a selecting unit selecting, from the deinterleave processing unit, the data subjected to the deinterleave processing with the parameters acquired by the acquiring unit.

14 Claims, 8 Drawing Sheets

FIG. 1

PRIOR ART

| | | LENGTH OF TIME INTERLEAVE (I VALUE) | | | |
|---|---|---|---|---|---|
| | | i1 | i2 | i3 | i4 |
| MODE NUMBER | MODE 1 | 0 | 4 | 8 | 16 |
| | MODE 2 | 0 | 2 | 4 | 8 |
| | MODE 3 | 0 | 1 | 2 | 4 |

DEMODULATING APPARATUS, DEMODULATING METHOD, AND COMPUTER-READABLE MEDIUM

CROSS-REFERENCES TO RELATED APPLICATIONS

The present invention contains subject matter related to Japanese Patent Application JP 2006-034760 filed in the Japanese Patent Office on Feb. 13, 2006, the entire contents of which being incorporated herein by reference.

BACKGROUND OF THE INVENTION

1. Field of the Invention

The present invention relates to a demodulating apparatus, a demodulating method, and a computer program, and, more particularly to a demodulating apparatus, a demodulating method, and a computer program for reducing time during which a video is not displayed at the time of tuning in a digital television broadcast.

2. Description of the Related Art

In recent years, a television broadcast is being changed from a terrestrial analog broadcast (hereinafter referred to as analog broadcast as appropriate) to a terrestrial digital broadcast (hereinafter referred to as digital broadcast as appropriate). In the digital broadcast, processing different from processing in the analog broadcast such as modulation and demodulation is performed on a transmission side and a reception side. When data of a program (data of video and sound) is modulated on the transmission side, data (parameters) concerning the modulation is transmitted from the transmission side to the reception side together with the data of the program.

A structure of an example of a receiving apparatus in the past will be explained with reference to FIG. 1. A receiving apparatus 10 shown in FIG. 1 has a function of receiving and processing a program provided by a digital television broadcast. In the following explanation, the "digital television broadcast" is abbreviated as "digital broadcast" as appropriate.

Figure 1:
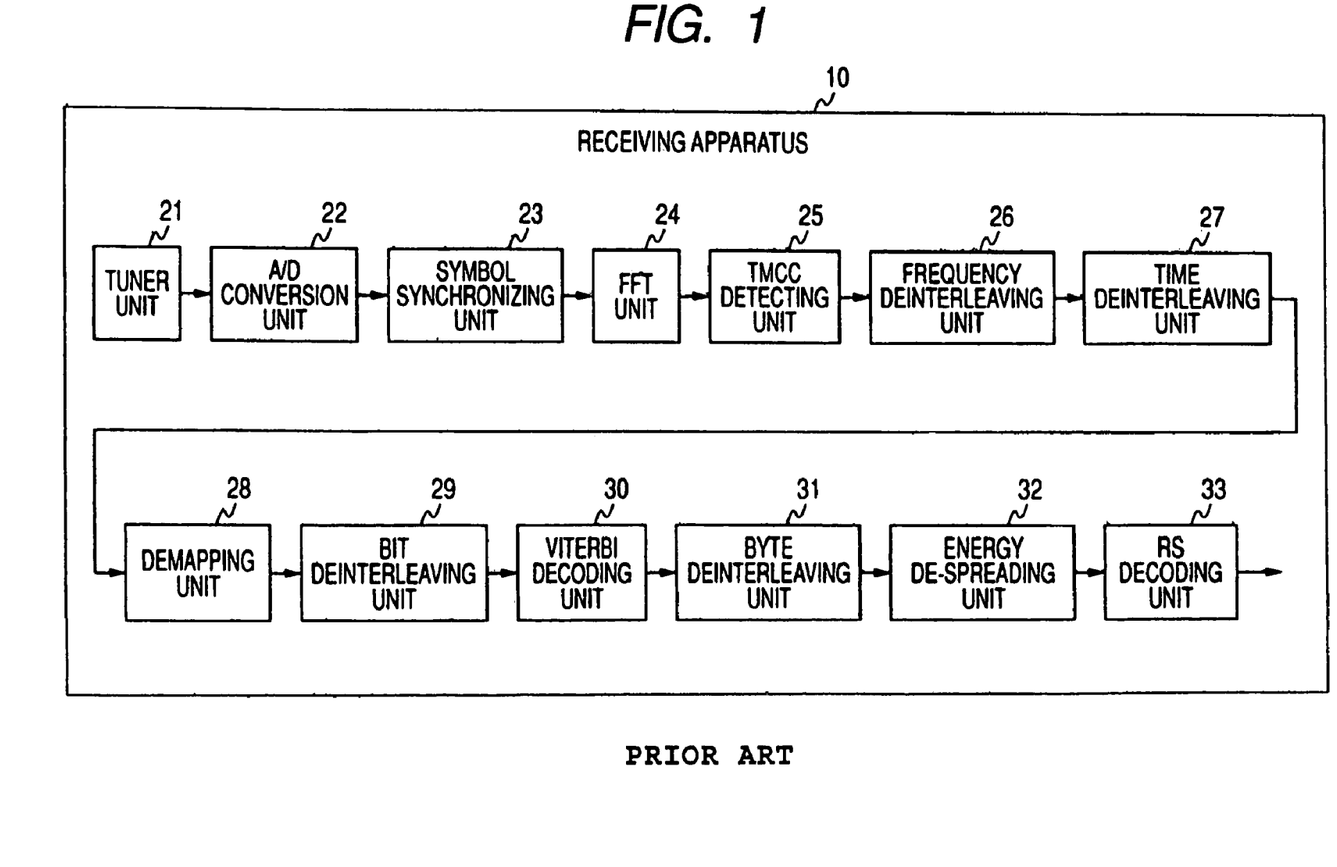
FIG. 1 is a diagram showing a structure of an example of a receiving apparatus in the past.

The receiving apparatus 10 shown in FIG. 1 includes a tuner unit 21, an A/D (Analog/Digital) conversion unit 22, a symbol synchronizing unit 23, an FFT (Fast Fourier transform) unit 24, a TMCC (Transmission & Multiplexing Configuration Control) detecting unit 25, a frequency deinterleaving unit 26, a time deinterleaving unit 27, a demapping unit 28, a bit deinterleaving unit 29, a Viterbi decoding unit 30, a byte deinterleaving unit 31, an energy de-spreading unit 32, and an RS decoding unit 33.

The digital broadcast broadcasted by a broadcasting station is received by a not-shown antenna and supplied to the tuner unit 21 as an RF (Radio Frequency) signal. The tuner unit 21 frequency-converts the RF signal supplied from the antenna into an IF (Intermediate Frequency) signal and filters the IF signal with a band-pass filter (BPF) built therein.

The filtered IF signal is supplied to the A/D conversion unit 22. The A/D conversion unit 22 A/D-converts the IF signal supplied and supplies the IF signal digitized to the symbol synchronizing unit 23. The symbol synchronizing unit 23 orthogonally demodulates the IF signal supplied using a carrier wave signal of a predetermined frequency (a carrier wave frequency) and generates an OFDM signal of a base band.

The OFDM signal (an OFDM time domain signal) of the base band generated is set as a complex signal including a real axis component (an I channel signal) and an imaginary axis component (a Q channel signal). Processing for calculating a boundary of an OFDM symbol of the base band, processing for setting arithmetic operation start timing for an FFT arithmetic operation in the FFT unit 24, and the like are also executed.

The FFT unit 24 extracts a signal for an effective symbol length from the OFDM time domain signal and applies the FFT arithmetic operation to the signal extracted. The signal from the FFT unit 24 is supplied to the TMCC detecting unit 25. The TMCC detecting unit 25 detects TMCC information from the signal supplied.

The frequency deinterleaving unit 26 applies deinterleave processing in a frequency direction to the signal supplied and supplies a signal after the deinterleave processing to the time deinterleaving unit 27. The time deinterleaving unit 27 applies, in accordance with the TMCC information supplied, deinterleave processing in a time direction to the signal supplied from the frequency deinterleaving unit 26 and supplies a signal after the deinterleave processing to the demapping unit 28.

The demapping unit 28 applies, in accordance with the TMCC information supplied, reallocation processing (demapping processing) for data to the signal carrier-demodulated (the complex signal) supplied from the time deinterleaving unit 27 and restores a transmission data sequence. For example, the demapping unit 28 performs demapping processing corresponding to QPSK, 16QAM, or 64QAM. The demapping unit 28 supplies the transmission data sequence restored to the bit deinterleaving unit 29.

The bit deinterleaving unit 29 applies deinterleave processing corresponding to bit interleave for error distribution of a multivalue symbol to the transmission data sequence supplied from the demapping unit 23 and supplies a signal after the deinterleave processing to the Viterbi decoding unit 30. The Viterbi decoding unit 30 applies Viterbi decode processing for decoding of a convolutional-coded bit string to the signal supplied and supplies a signal after the Viterbi decode processing to the byte deinterleaving unit 31.

The byte deinterleaving unit 31 applies deinterleave processing in a unit of byte to the signal supplied from the Viterbi decoding unit 30 and supplies a signal after the deinterleave processing to the energy de-spreading unit 32. The energy de-spreading unit 32 applies energy -de-spreading processing corresponding to energy diffusion processing to the signal supplied from the byte deinterleaving unit 31 and supplies a signal after the energy de-spreading processing to the RS decoding unit 33.

The RS decoding unit 33 applies Reed-Solomon (RS) decode processing to the transmission data sequence supplied and outputs the transmission data sequence as a transport stream defined by the MPEG-2 systems.

Processing by the time deinterleaving unit 27 will be explained. As shown in FIG. 1, the time deinterleaving unit 27 is provided at a post-stage of the frequency deinterleaving unit 26. The TMCC information detected by the TMCC detecting unit 25 is supplied to the time deinterleaving unit 27. The signal subjected to the deinterleave processing in the frequency direction is also supplied to the time deinterleaving unit 27 from the frequency deinterleaving unit 26.

The time deinterleaving unit 27 rearranges signals of an amount based on parameters included in the TMCC information. Therefore, according to the supply of the TMCC information, the time deinterleaving unit 27 starts to accumulate the signals in a buffer having a capacity corresponding to the parameters and, when a necessary amount of signals are accumulated, outputs the data rearranged. In other words, after the TMCC information is detected by the TMCC detecting unit 25 and supplied to the time deinterleaving unit 27, the processing by the time deinterleaving unit 27 is started.

In this way, on the reception side, when data of a program is demodulated, processing for demodulation is executed with reference to parameters transmitted to the reception side. The parameters transmitted and received include the TMCC signal as described above. The TMCC signal (TMCC information) is transmission multiplexing control signal and includes designation of a transmission system (designation of a modulation system and an error correction coding ratio, etc.) and information for transmitting a slot number for managing plural transport streams.

In order to acquire the TMCC information, since the TMCC signal (the TMCC information) has the length of one frame that is a temporal unit of a broadcast signal, it is necessary to acquire (receive) at least data for one frame. Therefore, for example, when a user tunes in a channel of the digital broadcast, it may be impossible to start the time deinterleave processing and perform change of a channel (start provision of a video to the user) until the TMCC information is received.

In order to reduce such time during which the user is not provided with a video, JP-A-2003-51795 proposes to store TMCC information detected when program data or the like is received last time and use the TMCC information for demodulation of program data received this time.

SUMMARY OF THE INVENTION

As described above, it is seen that, in the digital broadcast, it is possible to start demodulation that needs parameters such as TMCC information necessary for demodulation only after the parameters are received and there is time during which it is difficult to provide the user with a video at the time of change of a channel.

When parameters acquired once are stored and demodulation is performed using the parameters stored as described in JP-A-2003-51795, if the parameters stored are not accurate, it is difficult to use the TMCC information stored in advance at the time of tuning. Thus, processing time same as that at the time when tuning is not performed is necessary. Since identical values are not always set as the parameters, such inconvenience could occur.

Therefore, it is desirable to make it possible to reduce time for processing for tuning.

According to an embodiment of the invention, there is provided a demodulating apparatus including deinterleave processing means for applying deinterleave processing to supplied data for each of parameters necessary in executing deinterleave processing in a time direction, acquiring means for acquiring parameters with which the data should be processed, and selecting means for selecting, from the deinterleave processing means, the data subjected to the deinterleave processing with the parameters acquired by the acquiring means.

The parameters may be parameters concerning a transmission system.

The deinterleave processing means may discard data subjected to the deinterleave processing with parameters other than the parameters acquired by the acquiring means when the selection by the selecting means is performed.

According to the embodiment, there is provided a demodulating method or a computer program including the steps of performing control for applying deinterleave processing to supplied data for each of parameters necessary in executing deinterleave processing in a time direction, acquiring parameters with which the data should be processed, and selecting the data subjected to the deinterleave processing with the parameters acquired by processing in the acquiring step from the data for which the deinterleave processing is controlled in the deinterleave processing control step.

In the demodulating apparatus, the demodulating method, and the computer program, the deinterleave processing is applied to data for each of parameters and data subjected to the deinterleave processing on the basis of parameter, which should originally be used, is selected.

According to another embodiment of the invention, there is provided a demodulating apparatus including storing means for storing supplied data, flagging means for setting a flag for each of parameters necessary in executing deinterleave processing in a time direction when an amount of data corresponding to the parameters is stored in the storing means, acquiring means for acquiring parameters with which the data should be processed, and readout means for reading out and outputting, when the parameters are acquired by the acquiring means, the data stored in the storing means in an order corresponding to the parameters different from an order of storing the data if a flag corresponding to the parameters is set by the flagging means and reading out the data stored in the storing means, applying processing corresponding to the parameters to the data, and outputting the data in an order corresponding to the parameters different from the order of storing the data when the flag is set if a flag corresponding to the parameters is not set by the flagging means. The demodulating apparatus performs deinterleave processing in a time direction.

The parameters may be parameters concerning a transmission system.

According to another embodiment of the invention, there is provided a demodulating method or a computer program are a demodulating method or a computer program for a demodulating apparatus including storing means for storing supplied data. The demodulating method or the computer program includes the steps of setting a flag for each of parameters necessary in executing deinterleave processing in a time direction when an amount of data corresponding to the parameters is stored in the storing means, acquiring parameters with which the data should be processed, and reading out and outputting, when the parameters are acquired by processing in the acquiring step, the data stored in the storing means in an order corresponding to the parameters different from an order of storing the data if a flag corresponding to the parameters is set by processing in the flagging step and reading out the data stored in the storing means, applying processing corresponding to the parameters to the data, and outputting the data in an order corresponding to the parameters different from the order of storing the data when the flag is set if a flag corresponding to the parameters is not set in the flagging step. In the demodulating method or the computer program, deinterleave processing in a time direction is performed.

In the modulating method and the computer program, when an amount of data enough for starting processing with predetermined parameters is stored, a flag is set and processing for the data is executed.

According to an embodiment of the invention, it is possible to reduce time for processing for tuning in the digital broadcast.

DESCRIPTION OF THE PREFERRED EMBODIMENTS

Embodiments of the invention will be hereinafter explained. An example of a correspondence relation between elements of the invention and embodiments described or shown in the specification or the drawings is as described below. This description is a description for confirming that the embodiments supporting the invention are described or shown in the specification or the drawings. Therefore, even if there is an embodiment described or shown in the specification or the drawings but not described here as an embodiment corresponding to an element of the invention, this does not means that the embodiment does not correspond to the element. On the other hand, even if an embodiment is described here as an embodiment corresponding to an element, this does not means that the embodiment does not correspond to elements other than the element.

According to an embodiment of the invention, there is provided a demodulating apparatus (e.g., a time deinterleaving unit 67 in FIG. 3) including deinterleave processing means (e.g., time deinterleave units 81 to 84 in FIG. 3) for applying deinterleave processing to supplied data for each of parameters necessary in executing deinterleave processing in a time direction, acquiring means (e.g., a selector 85 in FIG. 3) for acquiring parameters with which the data should be processed, and selecting means (e.g., the selector 85 in FIG. 3) for selecting, from the deinterleave processing means, the data subjected to the deinterleave processing with the parameters acquired by the acquiring means.

According to another embodiment of the invention, there is provided a demodulating apparatus including storing means (e.g., a buffer 201 in FIG. 7) for storing supplied data, flagging means (e.g., flag setting units 202-1 to 202-4 in FIG. 7) for setting a flag for each of parameters necessary in executing deinterleave processing in a time direction when an amount of data corresponding to the parameters is stored in the storing means, acquiring means for acquiring parameters with which the data should be processed, and readout means (e.g., a readout control unit 203 in FIG. 7) for reading out and outputting, when the parameters are acquired by the acquiring means, the data stored in the storing means in an order corresponding to the parameters different from an order of storing the data if a flag corresponding to the parameters is set by the flagging means and reading out the data stored in the storing means, applying processing corresponding to the parameters to the data, and outputting the data in an order corresponding to the parameters different from the order of storing the data when the flag is set if a flag corresponding to the parameters is not set by the flagging means.

Embodiments of the invention will be hereinafter explained with reference to the accompanying drawings.

First Embodiment

Figure 2:
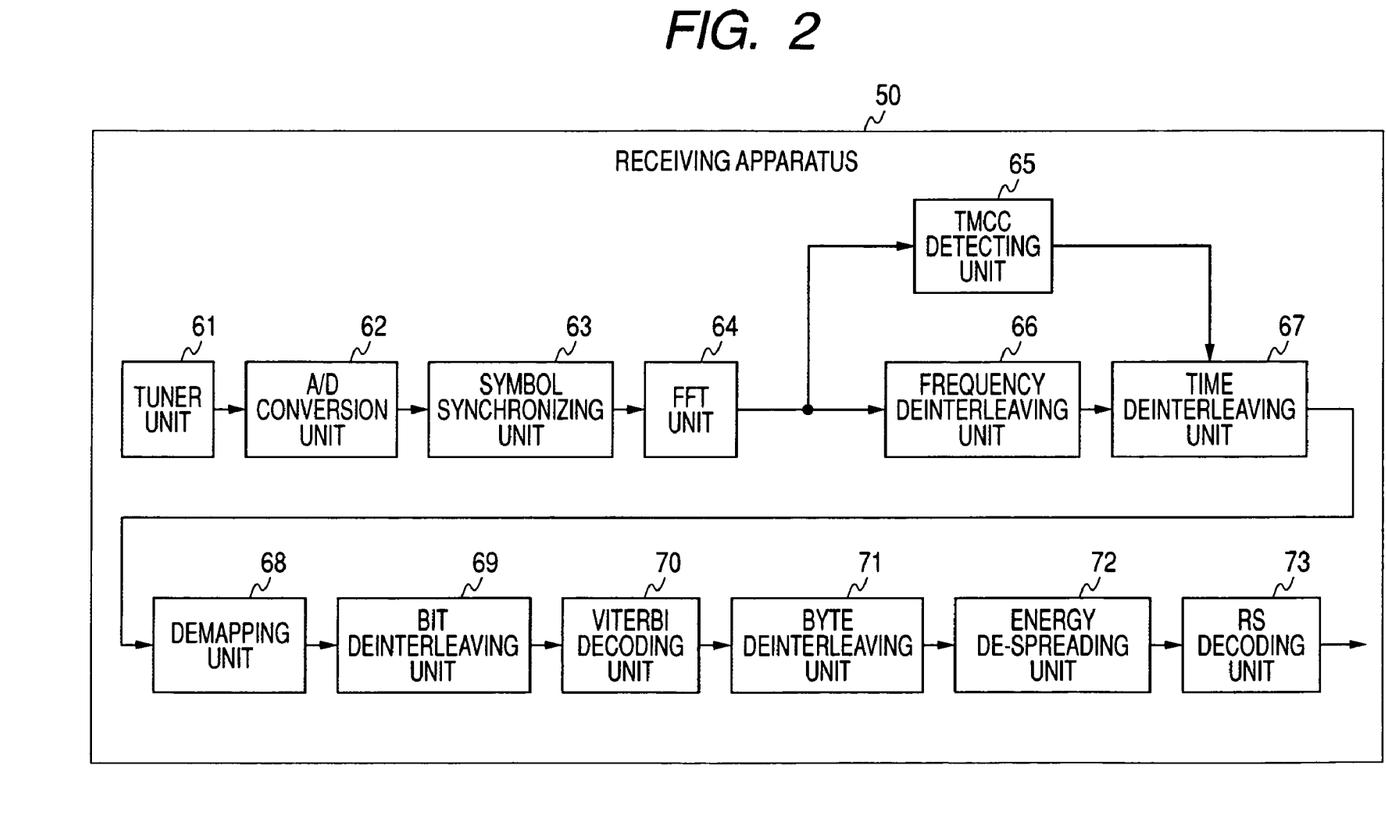
FIG. 2 is a diagram showing a structure of a receiving apparatus according to a first embodiment of the invention.

FIG. 2 is a diagram showing a structure of a receiving apparatus according to a first embodiment of the invention. A receiving apparatus 50 shown in FIG. 2 has a function of receiving and processing a program provided by a digital television broadcast. In the following explanation, the "digital television broadcast" is abbreviated as "digital broadcast" as appropriate.

It is possible to apply the receiving apparatus 50 to an apparatus that is built in equipment for processing a television broadcast such as a television receiver, a set top box (STB), and a hard disk recorder and processes the digital broadcast.

In the receiving apparatus 50 shown in FIG. 2, a section that executes processing called front-end processing in the apparatus that receives and processes the digital broadcast is extracted and described below. The other sections are not described.

The receiving apparatus 50 shown in FIG. 2 includes a tuner unit 61, an A/D (Analog/Digital) conversion unit 62, a symbol synchronizing unit 63, an FFT (Fast Fourier transform) unit 64, a TMCC (Transmission & Multiplexing Configuration Control) detecting unit 65, a frequency deinterleaving unit 66, a time deinterleaving unit 67, a demapping unit 68, a bit deinterleaving unit 69, a Viterbi decoding unit 70, a byte deinterleaving unit 71, an energy de-spreading unit 72, and an RS decoding unit 73.

A digital broadcast broadcasted by a broadcasting station is received by a not-shown antenna and supplied to the tuner unit 61 as an RF (Radio Frequency) signal. The tuner unit 61 frequency-converts the RF signal supplied from the antenna into an IF (Intermediate Frequency) signal and filters the If signal using a band-pass filter (BPF) built therein.

The signal filtered is supplied to the A/D converting unit 62. The A/D converting unit 62 A/D-converts the IF signal supplied and supplies the IF signal digitized to the symbol synchronizing unit 63. The symbol synchronizing unit 63 orthogonally demodulates the IF signal supplied using a carrier wave signal of a predetermined frequency (a carrier wave frequency) and generates an OFDM signal of a base band.

The OFDM signal (an OFDM time domain signal) of the base band generated is set as a complex signal including a real axis component (an I channel signal) and an imaginary axis component (a Q channel signal). Processing for calculating a boundary of an OFDM symbol of the base band, processing for setting arithmetic operation start timing for an FFT arithmetic operation in the FFT unit 64, and the like are also executed.

The FFT unit 64 extracts a signal for an effective symbol length from the OFDM time domain signal and applies the FFT arithmetic operation to the signal extracted. A signal from the FFT unit 64 is supplied to the TMCC detecting unit 65 and the frequency deinterleaving unit 66. The TMCC detecting unit 65 detects TMCC information (transmission control information) from the signal supplied. A TMCC signal is a signal for transmitting designation of a transmission system (designation of a modulation system and an error correction coding ratio) and slot number information for managing plural transport streams (TSs). The TMCC information is information included in such a TMCC signal.

The frequency deinterleaving unit 66 applies deinterleave processing in a frequency direction to the signal supplied and supplies a signal after the deinterleave processing to the time deinterleaving unit 67. The time deinterleaving unit 67 applies, in accordance with transmission control information supplied, deinterleave processing in a time direction to the signal supplied from the frequency deinterleaving unit 66 and supplies a signal after the deinterleave processing to the demapping unit 68.

The demapping unit 68 applies, in accordance with the transmission control information supplied, reallocation processing (demapping processing) for data to the signal carrier-demodulated (the complex signal), which is supplied from the time deinterleaving unit 67, and restores a transmission data sequence. For example, the demapping unit 68 performs demapping processing corresponding to QPSK, 16QAM, or 64QAM. The demapping unit 68 supplies the transmission data sequence restored to the bit deinterleaving unit 69.

The bit deinterleaving unit 69 applies deinterleave processing corresponding to bit interleave for error distribution of a multivalue symbol to the transmission data sequence supplied from the demapping unit 63 and supplies a signal after the deinterleave processing to the Viterbi decoding unit 70. The Viterbi decoding unit 70 applies Viterbi decode processing for decoding of a convolutional-coded bit string to the signal supplied and supplies a signal after the Viterbi decode processing to the byte deinterleaving unit 71.

The byte deinterleaving unit 71 applies deinterleave processing in a unit of byte to the signal supplied from the Viterbi decoding unit 70 and supplies a signal after the deinterleave processing to the energy de-spreading unit 72. The energy de-spreading unit 72 applies energy de-spreading processing corresponding to energy diffusion processing to the signal supplied from the byte deinterleaving unit 71 and supplies a signal after the energy de-spreading processing to the RS decoding unit 73.

The RS decoding unit 73 applies Reed-Solomon (RS) decode processing to the transmission data sequence supplied and outputs the transmission data sequence as a transport stream defined by the MPEG-2 systems.

The time deinterleaving unit 67 according to the first embodiment will be explained. In order to clarify a difference between the time deinterleaving unit 67 according to the first embodiment and the time deinterleaving unit 27 in the past (FIG. 1), the time deinterleaving unit 27 will be briefly explained.

The time deinterleaving unit 27 applies deinterleave processing to a supplied signal using TMCC information. In other words, in this case, after the TMCC information is detected by the TMCC detecting unit 25 and supplied to the time deinterleaving unit 27, the processing by the time deinterleaving unit 27 is started.

Since this TMCC information has the length of one frame that is a temporal unit of a broadcast signal, in order to acquire the TMCC information, it is necessary to wait until a signal for at least one frame is received. Such a waiting time means that, when a user tunes in a channel, processing for switching to the tuned channel takes time and time during which the user is not provided with a video occurs. Thus, it is preferable to reduce such time.

Figure 3:
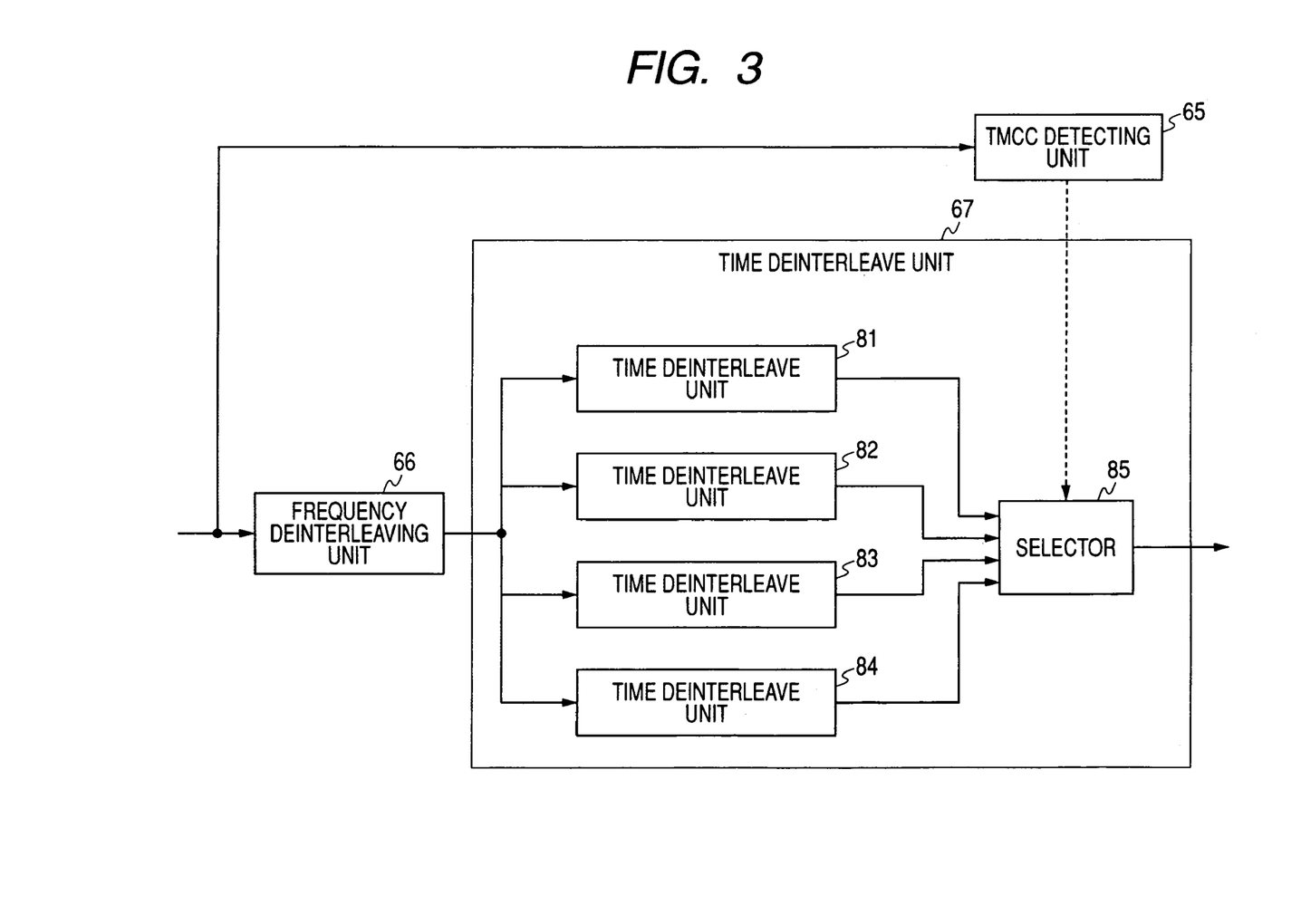
FIG. 3 is a diagram showing an example of a structure of a time deinterleaving unit according to the embodiment.

In order to reduce the time during which the user is not provided with a video, in this embodiment, a structure shown in FIG. 3 is adopted for the time deinterleaving unit 67. The time deinterleaving unit 67 according to this embodiment shown in FIG. 3 includes four time deinterleave units 81 to 84. The time deinterleaving unit 67 also includes a selector 85 for selecting one output from outputs of the four time deinterleave units 81 to 84 and outputting the output.

The time deinterleaving unit 67 needs to acquire parameters such as a Mode number and length of time deinterleave (an I value) to perform the time deinterleave. Among the parameters necessary when the time deinterleaving unit 67 executes the time deinterleave processing, the Mode number and the like excluding the I value are parameters used for TMCC detection processing (processing by the TMCC detecting unit 65) as well. Thus, the parameters are detected until the TMCC detection and the time deinterleave processing.

However, concerning the I value, an I value of the TMCC information recorded in the TMCC signal is detected and used. Under such circumstances, the time deinterleave processing is executed after the TMCC information is detected. As described above, this causes an inconvenient situation in which the time during which the user is not provided with a video occurs.

Figure 4:
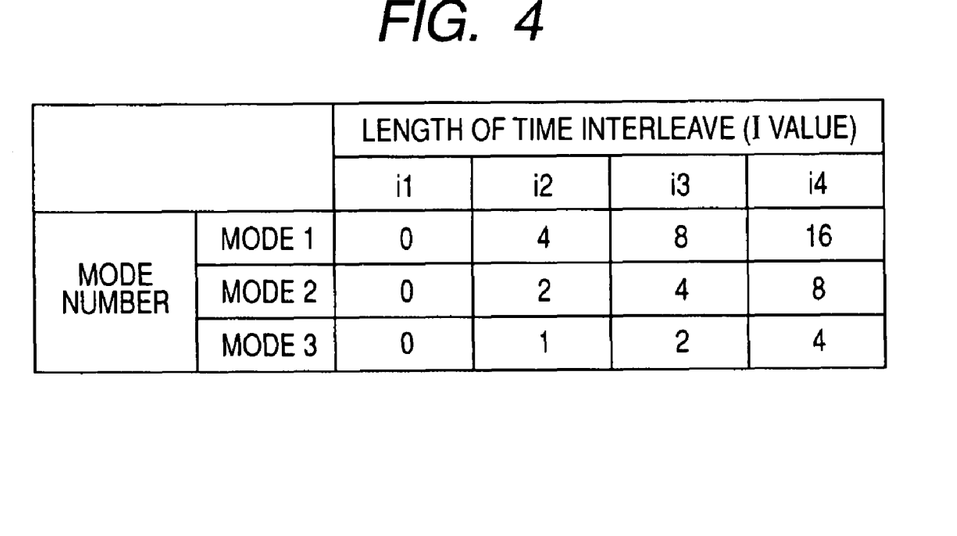
FIG. 4 is a table for explaining I values.

For example, as defined in the ARIB (Association of Radio Industries and Businesses) standard STD B-31, only a limited number of I values are set. The I values defined in the ARIB standard STD B-31 are set as shown in FIG. 4. As shown in FIG. 4, four I values (i1, i2, i3, and i4) are set for each of Mode numbers (Mode 1, Mode 2, and Mode 3).

As described above, a mode number is acquired before the deinterleave processing is executed by the time deinterleaving unit 67 (before an I value is acquired). Thus, when a signal from the frequency deinterleaving unit 66 is supplied to the time deinterleaving unit 67, a Mode has been determined. A value that can be taken as the I value has been limited to any one of i1, i2, i3, and i4 in the Mode.

In this way, the value set as the I value is limited to four. Thus, as shown in FIG. 3, the time deinterleaving unit 67 includes the four time deinterleave units 81 to 84 that execute the deinterleave processing using the respective I values.

In FIG. 3, the time deinterleave unit 81 is a unit that executes processing assuming that the I value is i1 (the length of the time deinterleave is 0). The time deinterleave unit 82 is a unit that executes the time deinterleave processing assuming that the I value is i2 (the length of the time deinterleave is 4). The time deinterleave unit 83 is a unit that executes processing assuming that the I value is i3 (the length of the time deinterleave is 8). The time deinterleave unit 84 is a unit that executes the time deinterleave processing assuming that the I value is i4 (the length of the time deinterleave is 16).

In this explanation, the I values defined in the ARIB standard STD B-31 are set as shown in FIG. 4 and, when one mode is determined, only four I values are taken. Thus, as shown in FIG. 3, the time deinterleaving unit 67 includes the four time deinterleave units 81 to 84. However, this does not indicate that the number of time deinterleave units included in the time deinterleaving unit 67 is limited to four.

For example, the time deinterleaving unit 67 may include four or more time deinterleave units. Preparing for a case in which four or more I values are set (e.g., i5 is provided anew), four or more time deinterleave units may be provided. It goes without saying that the number of time deinterleave unit may be equal to or smaller than four. In this explanation, to make it possible to cope with a case in which the I value is i1, i.e., a case in which the length of the time deinterleave is 0, the time deinterleave unit 81 is provided. However, when the length of the time deinterleave is 0, the deinterleave processing itself does not have to be performed. Thus, the time deinterleave unit 81 does not have to be provided (i.e., only the three time deinterleave units 82 to 84 have to be provided).

In this way, in the time deinterleaving unit 67, the number of time deinterleave units provided therein is determined according to the number of I values and is not limited to four.

The time deinterleaving unit 67 can simultaneously perform the deinterleave processing in different I values. In order to simultaneously perform the deinterleave processing in different I values, the time deinterleaving unit 67 includes plural time deinterleave units, i.e., the time deinterleave units 81 to 84 as shown in FIG. 3.

Processing by the time deinterleaving unit 67 shown in FIG. 3 will be explained with reference to a flowchart in FIG. 5. In step S11, the time deinterleaving unit 67 applies the deinterleave processing in the time direction to a signal subjected to the deinterleave processing in the frequency direction, which is supplied from the frequency deinterleaving unit 66. The signal from the frequency deinterleaving unit 66 is supplied to the time deinterleave units 81 to 84 constituting the time deinterleaving unit 67.

When the signal from the frequency deinterleaving unit 66 is supplied to the time deinterleaving unit 67, information on a Mode number has already been detected. Thus, I values corresponding to the Mode number are set for the time deinterleave units 81 to 84, respectively. For example, when the Mode number is "1", an I value of the time deinterleave unit 81 is set to "0" (see FIG. 4), an I value of the time deinterleave unit 82 is set to "4", an I value of the time deinterleave unit 83 is set to "8", and an I value of the time deinterleave unit 84 is set to "16".

The time deinterleave units 81 to 84 for which the I values are set in this way apply the deinterleave processing in the time direction in the set I values to the signal from the frequency deinterleaving unit 66, respectively.

When the signal is supplied to the time deinterleave units 81 to 84 in this way, the deinterleave processing is started. While the deinterleave processing is executed in the time deinterleave units 81 to 84, the TMCC detecting unit 65 (FIG. 3) detects TMCC information. Information on an I value is also included in this TMCC information. When the TMCC detecting unit 65 detects the I value, the TMCC detecting unit 65 supplies the I value to the time deinterleaving unit 67.

In step S12 (FIG. 5), the selector 85 acquires an I value from the TMCC detecting unit 65. The I value acquired is a value that should originally be set when the deinterleave processing in the time direction is executed. In other words, the I value acquired is an I value necessary for executing correct deinterleave processing at that point.

In this way, in the first embodiment, supplied signals are simultaneously and separately subjected to the deinterleave processing with all I values that can be taken and, while the deinterleave processing is performed, a correct I value is acquired.

In step S13, an output subjected to the deinterleave processing with the correct I value is selected out of outputs from the time deinterleave units 81 to 84 on the basis of the correct I value acquired.

The information on the I value from the TMCC detecting unit 65 is supplied to the selector 85 (FIG. 3) of the time deinterleaving unit 67. When the I value is supplied, the selector 85 selects an output from the time deinterleave units 81 to 84 set to the I value supplied and outputs the output to the demapping unit 68 (FIG. 2).

In this way, when the selector 85 acquires the correct I value, the selector 85 outputs a signal subjected to the deinterleave processing with the correct I value. Thus, compared with the case in which the deinterleave processing is started after an I value is acquired as in the past, it is possible to reduce time until a signal is supplied to the demapping unit 68. According to this embodiment, it is possible to reduce a processing time in the receiving apparatus 50 (a section that executes front-end processing) shown in FIG. 2.

Figure 6A:
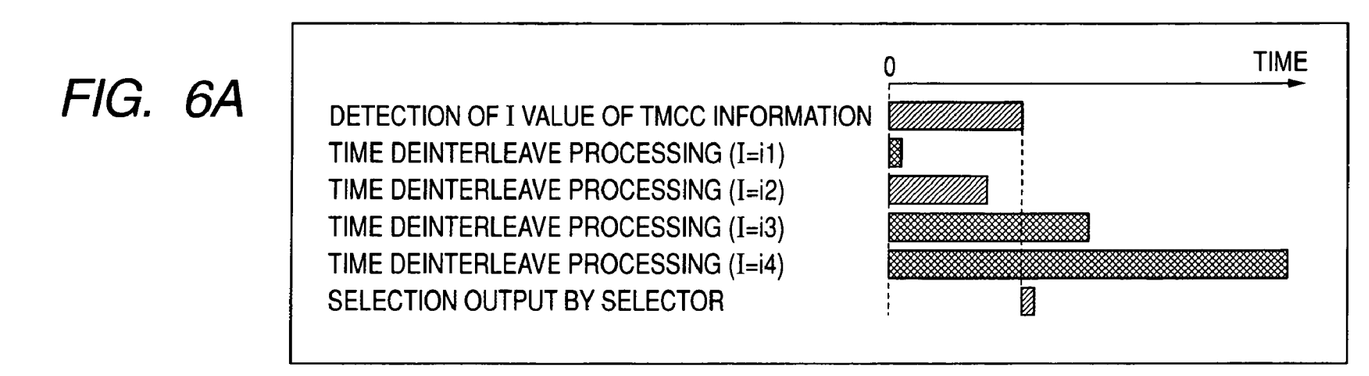
FIGS. 6A and 6B are diagrams for explaining timing for detection of I values and timing for output of processing results of time deinterleave processing.
Figure 6B:
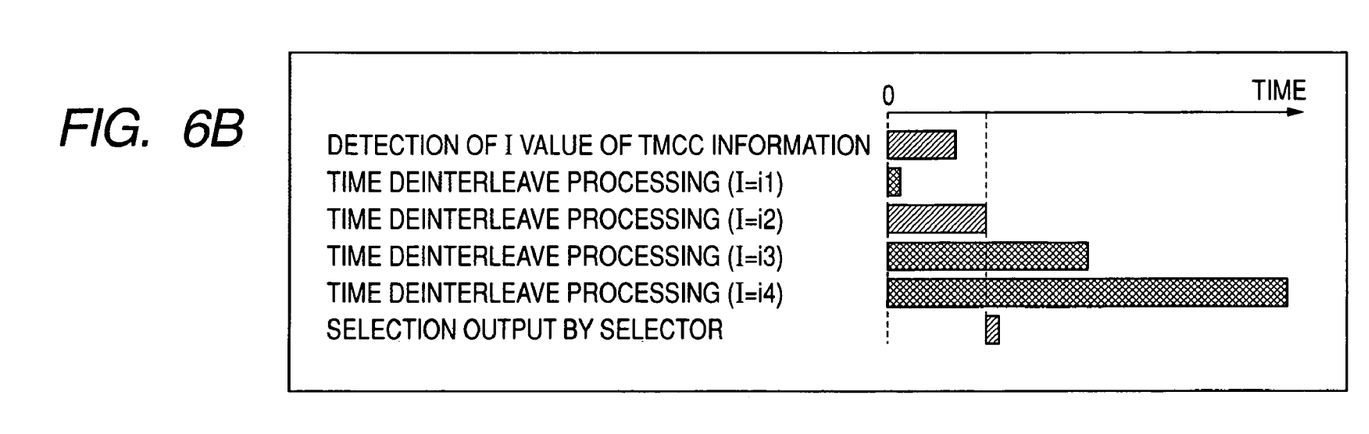

As timing when the I value is supplied to the selector 85, timing shown in FIG. 6A and timing shown in FIG. 6B are conceivable. In both FIGS. 6A and 6B, in order from the top, time until "detection of an I value of TMCC information" is performed, time until "time deinterleave processing (I=i1)" is finished, time until "time deinterleave processing (I=i2)" is finished, time until "time deinterleave processing (I=i3)" is finished, time until "time deinterleave processing (I=i4)" is finished, and timing when "selection output by a selector" is performed are shown.

In FIGS. 6A and 6B, an I value supplied to the selector 85 is "I=i2" and an output selected and outputted by the selector 85 is an output from the time deinterleave unit 82 (FIG. 3) set to "I=i2".

In FIG. 6A, the time until detection of an I value of TMCC information is longer than the time until the deinterleave processing in the time direction is finished in the time deinterleave unit 82 for which the I value is set to "i2". In FIG. 6B, the former is shorter than the latter.

In a state shown in FIG. 6A, i.e., when the I value is detected, processing by the time deinterleave unit 82 set to the I value detected (in this case, i2) has been finished. Thus, when the I value is detected, an output from the time deinterleave unit 82 is selected and outputted by the selector 85.

In a state shown in FIG. 6B, i.e., when the I value is detected, processing by the time deinterleave unit 82 set to the I value detected (in this case, i2) has not been finished. Thus, when the I value is detected, the selector 85 is set to select an output from the time deinterleave unit 82. When the processing by the time deinterleave unit 82 is finished, the selector 85 outputs a result of the processing.

In this way, in association with timing when the correct I value is acquired and timing of the finish of the deinterleave processing, a signal subjected to the deinterleave processing in the time direction is outputted. Thus, the time deinterleave units 81 to 84 include buffers that store signals for the deinterleave processing from a point when the signal from the frequency deinterleaving unit 66 is supplied to a point when the I value is supplied to the selector 85.

When an I value is supplied to the selector 85 and a time deinterleave unit that executes the deinterleave processing corresponding to the I value is selected, it is possible to clear buffers of time deinterleave units other than the time deinterleave unit selected and suspend processing by the time deinterleave units.

For example, in the case of the state shown in FIG. 6A, when an I value is acquired, the deinterleave processing for which the I value is set to "i1" and the deinterleave processing for which the I value is set to "i2" have been finished. In this case, since "i2" is a correct I value, a result of the deinterleave processing for which the I value is set to "i2" is outputted. Since it is unnecessary to continue the deinterleave processing for which the I value is set to "i3" or "i4" from a point when a result of the deinterleave processing is outputted, the deinterleave processing is suspended. The buffers included in the time deinterleave units 81 to 84 are cleared. In other words, data unnecessary any more is discarded when the data becomes unnecessary.

Since the deinterleave processing in the time direction is executed in this way, the time deinterleave units 81 to 84 include the buffers, respectively, as explained above. However, the time deinterleave units 81 to 84 may share one buffer (memory). A control unit (not shown) (including, for example, a CPU (Central Processing Unit)) that controls input and output to the buffer may be provided. In other words, the time deinterleaving unit 67 may include the memory and the control unit.

Figure 5:
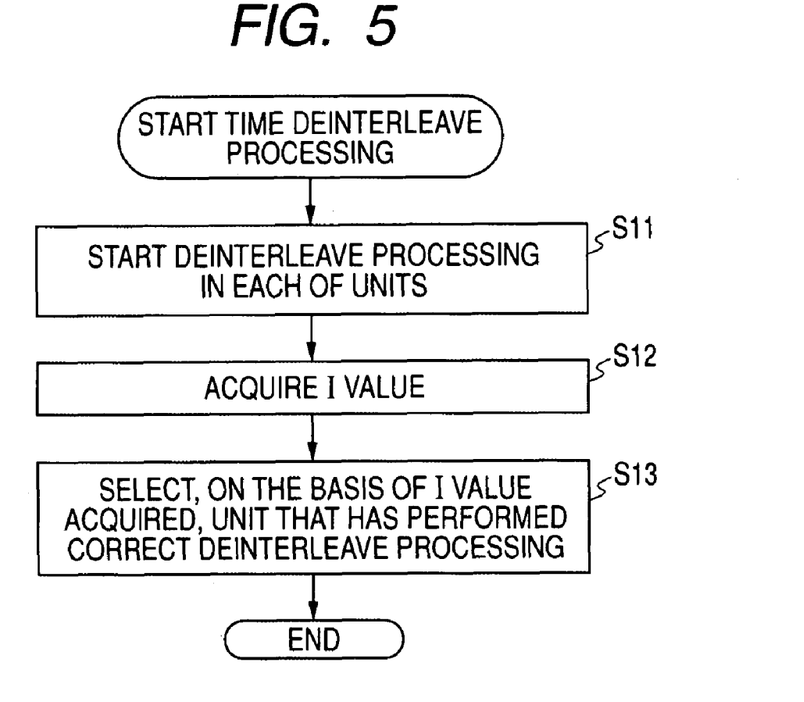
FIG. 5 is a flowchart for explaining processing by the time deinterleaving unit.

When the control unit is provided, the control unit controls the processing based on the flowchart shown in FIG. 5. A computer program necessary for the control unit to perform control is recorded in a recording medium or the like. Unlike the time deinterleave units 81 to 84, it is unnecessary to prepare four computer programs on the basis of I values. The computer program may be realized by one computer program. The recording medium will be briefly explained below.

Second Embodiment

In the example explained in the first embodiment, the time deinterleave units 81 to 84 are provided for each of I values, the time deinterleave processing based on the I value set in each of the time deinterleave units 81 to 84 is carried out in the time deinterleave unit, and, when the I value is acquired, any one of the time deinterleave units 81 to 84 that carries out the time deinterleave processing with the I value acquired at that point is selected.

In other words, in the first embodiment, signals are accumulated in the time deinterleave units until an amount of signals based on the I value set in each of the time deinterleave units is accumulated and, then, a signal is selected from a result obtained by rearranging an order of the signals on the basis of an acquired accurate I value and outputted.

In a second embodiment of the invention explained below, signals of a necessary amount are accumulated in time deinterleave units until an amount of signals based on an I value set in each of the time deinterleave units is accumulated and, then, the signals are read out in an order based on an acquired accurate I value and outputted. A time deinterleaving unit 67' that executes such processing has a structure shown in FIG. 7. In order to distinguish the time deinterleaving unit 67' from the time deinterleaving unit 67 shown in FIG. 3, the time deinterleave unit 67' is denoted by the reference numeral with "'".

Figure 7:
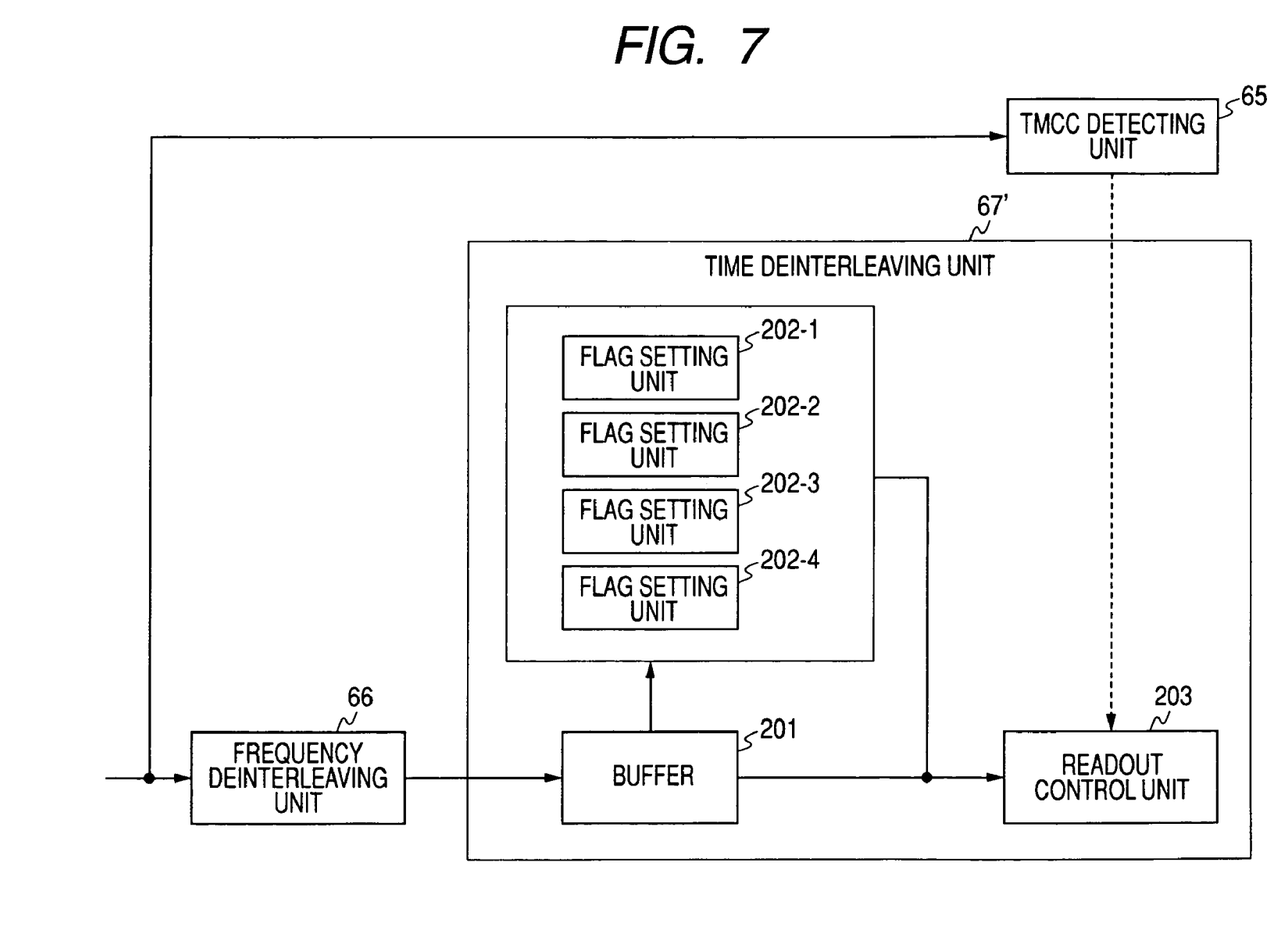
FIG. 7 is a diagram showing a structure of a time deinterleaving unit according to an embodiment of the invention.

The time deinterleaving unit 67' shown in FIG. 7 includes a buffer 201, flag setting units 202-1 to 202-4, and a readout control unit 203. The buffer 201 stores data from the frequency deinterleaving unit 66, i.e., data to be subjected to the deinterleave processing in the time direction.

The flag setting units 202-1 to 202-4 have a function of setting a flag when an amount of data enough for executing the time deinterleave processing with an I value set in advance is stored in the buffer 201. In this case, when an amount of data necessary for start of the time deinterleave processing at the time when the I value is i1 (the length of the time deinterleave is 0) is stored in the buffer 201, a flag of the flag setting unit 202-1 is set. When an amount of data necessary for start of the time deinterleave processing at the time when the I value is i2 (the length of the time deinterleave is 4) is stored in the buffer 201, a flag of the flag setting unit 202-2 is set.

When an amount of data necessary for start of the time deinterleave processing at the time when the I value is i3 (the length of the time deinterleave is 8) is stored in the buffer 201, a flag of the flag setting unit 202-3 is set. When an amount of data necessary for start of the time deinterleave processing at the time when the I value is i4 (the length of the time deinterleave is 16) is stored in the buffer 201, a flag of the flag setting unit 202-4 is set.

When an I value is supplied from the TMCC detecting unit 65, the readout control unit 203 refers to one of the flag setting units 202-1 to 202-4 corresponding to the I value supplied. If a flag of the flag setting unit referred to is set, the readout control unit 203 reads out data in an order corresponding to the I value different from an order of writing the data in the buffer 201. If the flag is not set, the readout control unit 203 is on standby until the flag is set (until data of a necessary amount are stored in the buffer 201). When the flag is set, the readout control unit 203 reads out the data in the order corresponding to the I value different from the order of writing the data in the buffer 201.

Operations of the time deinterleaving unit 67' having such a structure will be explained with reference to flowcharts in FIGS. 8 and 9. Processing for setting of a flag performed by each of the flag setting units 202-1 to 202-4 will be explained with reference to the flowchart in FIG. 8. Processing performed by the readout control unit 203 while such processing for setting a flag is performed will be explained with reference to the flowchart in FIG. 9.

Figure 8:
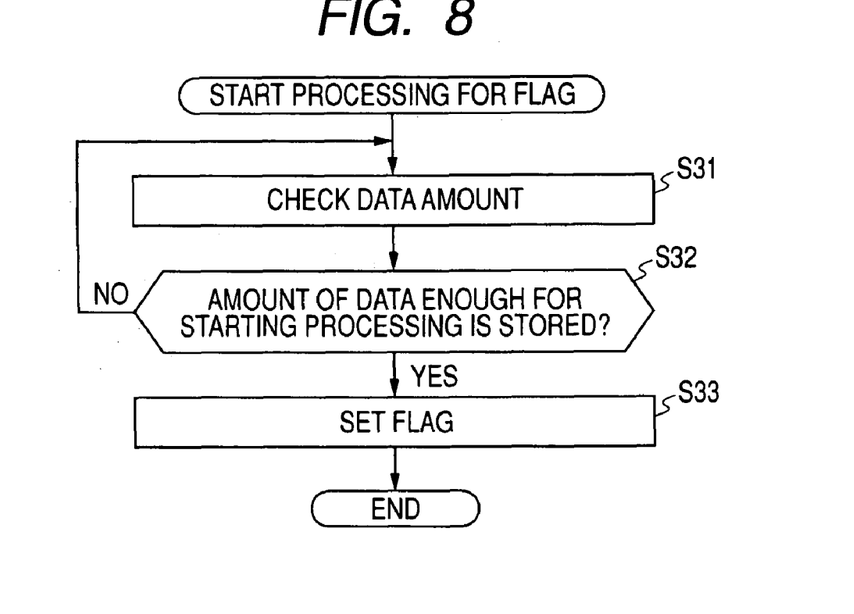
FIG. 8 is a flowchart for explaining processing for a flag.

The processing of the flowchart in FIG. 8 is processing performed by each of the flag setting units 202-1 to 202-4. When it is unnecessary to distinguish the flag setting units 202-1 to 202-4 from one another, the flag setting units 202-1 to 202-4 are simply described as a flag setting unit 202.

In step S31, the flag setting unit 202 checks an amount of data stored in the buffer 201. In step S32, the flag setting unit 202 judges whether an amount data enough for starting the time deinterleave processing is stored using a result of processing in step S31. The amount of data forming a basis of this judgment is different for each of the flag setting units 202-1 to 202-4. For example, as explained with reference to FIGS. 6A and 6B, since an amount of data necessary for starting the processing is different for each of the I values (i1, i2, i3, and i4), the amount of data forming the basis of the judgment in step S32 is different for each of the flag setting units 202-1 to 202-4.

The processing in steps S31 and S32 is repeated until it is judged in step S32 that the amount of data enough for starting the time deinterleave processing is stored in the buffer 201. When it is judged in step S32 that the amount of data enough for starting the time deinterleave processing is stored in the buffer 201, the processing proceeds to step S33 and a flag is set.

In this way, each of the flag setting units 202-1 to 202-4 sets a flag when the amount of data enough for starting the time deinterleave processing with the I value set for the flag setting unit is stored in the buffer 201.

Figure 9:
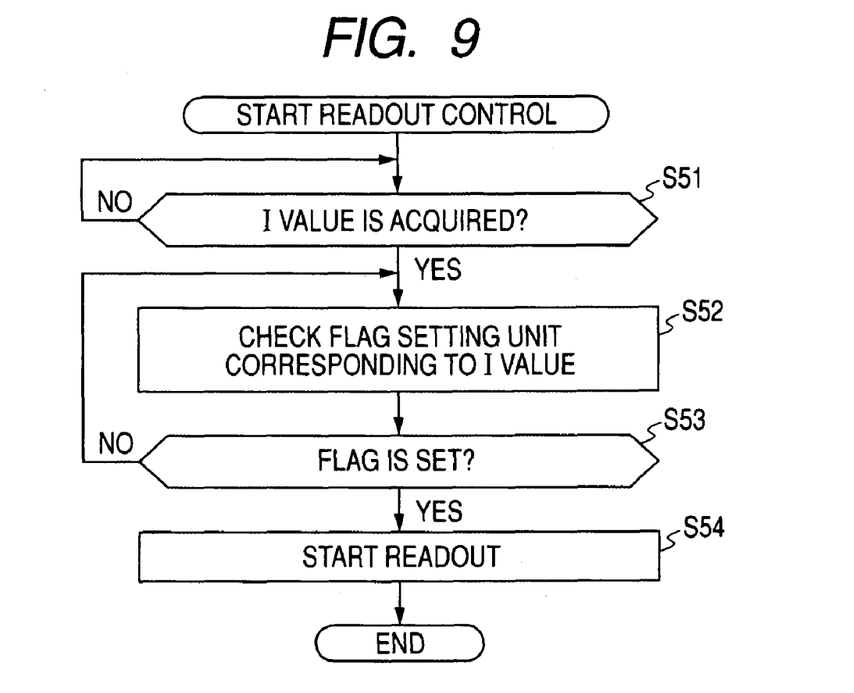
FIG. 9 is a flowchart for explaining readout control.

While the flag setting unit 202 executes such processing, the readout control unit 203 executes processing based on the flowchart in FIG. 9.

In step S51, the readout control unit 203 judges whether an I value is acquired from (supplied from) the TMCC detecting unit 65. When it is judged in step S51 that the I value is acquired from the TMCC detecting unit 65, the processing proceeds to step S52 and the readout control unit 203 checks the flag setting unit 202 corresponding to the I value acquired. For example, when the I value acquired is i2, the readout control unit 203 checks the flag setting unit 202-2.

In step S53, the readout control unit 203 judges whether a flag is set in the flag setting unit 202 checked using a result of the check in step S52. The processing in steps S52 and S53 is repeated until it is judged that a flag is set. When it is judged in step S53 that a flag is set, the processing proceeds to step S54.

In step S54, the readout control unit 203 starts readout. This readout is processing for, to rearrange the data according to the I value acquired in step S51, reading out and outputting data from the buffer 201 in an order corresponding to the I value different from an order of writing the data.

In the first embodiment, data obtained by rearranging the data supplied from the frequency deinterleaving unit 66 are recorded on the buffer (each of the time deinterleave units 81 to 84) and the data with an order changed are selected and read out by the selector 85. In the second embodiment, the loop for directly recording supplied data in the buffer 201 and checking whether the data are recorded in an amount of data corresponding to the I value is repeated and, when the data reach the amount of data, an order for reading out the data from the buffer 201 is changed to replace an order at the time of recording by the readout control unit 203.

In the second embodiment, it is possible to obtain effects same as those in the first embodiment.

The embodiments are explained with the time deinterleaving unit 67 (or the time deinterleaving unit 67') that processes the TMCC information as an example. However, the application of the invention is not limited to the TMCC information. The TMCC information is information for transmitting designation of a transmission system (designation of a modulation system and an error correction, coding ratio, etc.) and a slot number for managing plural transport streams. However, for example, it is also possible to apply the invention when other information is treated.

Figure 10:
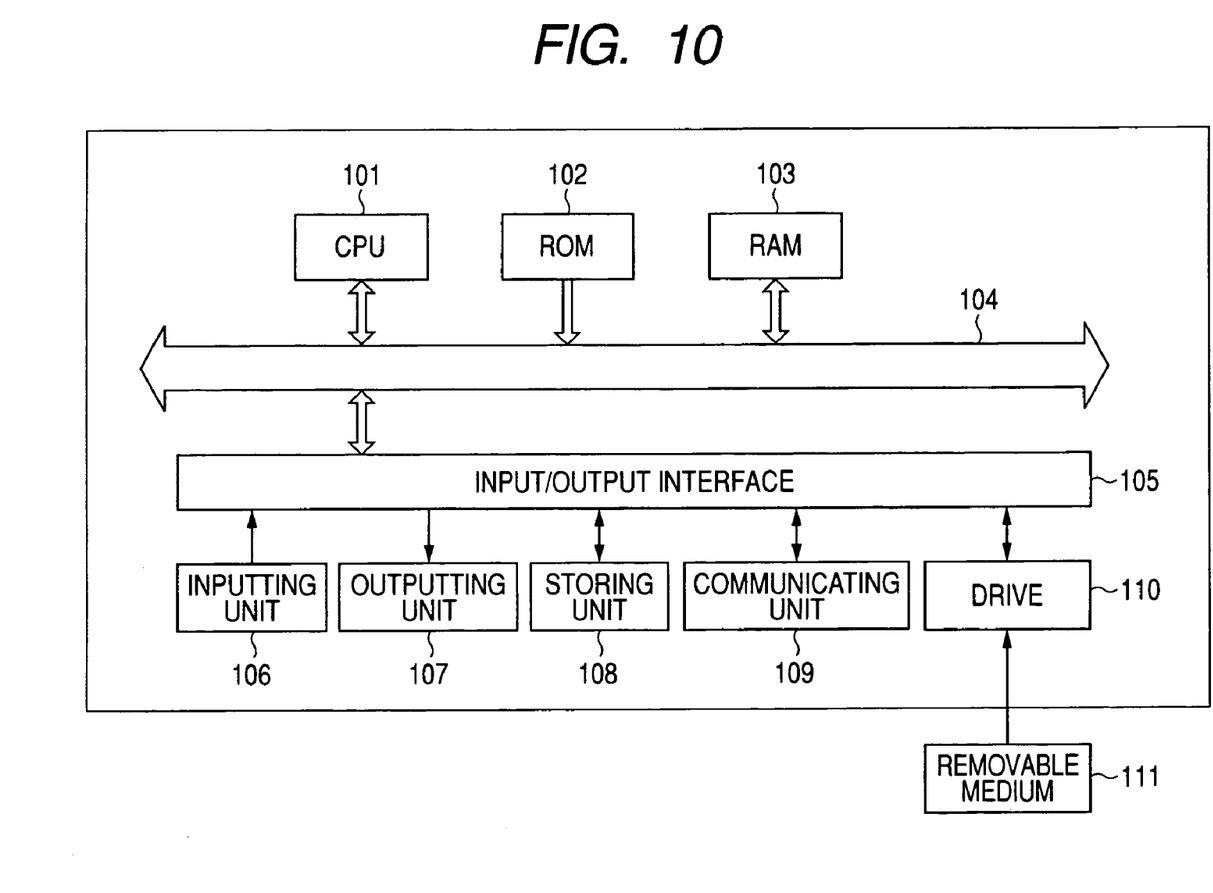
FIG. 10 is a diagram for explaining a recording medium.

FIG. 10 is a block diagram showing an example of a structure of a personal computer that executes the series of processing described above according to a computer program. A CPU (Central Processing Unit) 101 executes various kinds of processing in accordance with a computer program stored in a ROM (Read Only Memory) 102 or a storing unit 108. Computer programs executed by the CPU 101, data, and the like are stored in a RAM (Random Access Memory) 103 as appropriate. The CPU 101, the ROM 102, and the RAM 103 are connected to one another via a bus 104.

An input/output interface 105 is also connected to the CPU 101 via the bus 104. An inputting unit 106 including a keyboard, a mouse, and a microphone and an outputting unit 107 including a display and a speaker are connected to the input/output interface 105. The CPU 101 executes various kinds of processing in response to commands inputted from the inputting unit 106. The CPU 101 outputs results of the processing to the outputting unit 107.

The storing unit 108 connected to the input/output interface 105 is formed by, for example, a hard disk and stores computer programs executed by the CPU 101 and various data. A communicating unit 109 communicates with apparatuses on the outside via networks such as the Internet and a local area network.

The personal computer may acquire a computer program via the communicating unit 109 and store the computer program in the storing unit 108.

A drive 110 connected to the input/output interface 105 drives a removable medium 111 such as a magnetic disk, an optical disk, a magneto-optical disk, or a semiconductor memory when the removable medium 111 is inserted therein and acquires a computer program, data, and the like recorded in the removable medium 111. The computer program and the data acquired is transferred to the storing unit 108 and stored therein when necessary.

A program storage medium that stores a computer program installed in the personal computer and made executable by the computer is, as shown in FIG. 10, the removable medium 111 that is a package medium such as an optical disk (including a CD-ROM (Compact Disc-Read Only Memory) and a DVD (Digital Versatile Disc)), a magneto-optical disk (including an MD (Mini-Disc)), or a semiconductor memory, the ROM 102 in which the computer program is stored temporarily or permanently, or the hard disk forming the storing unit 108. The computer program is stored in the program storage medium via the communicating unit 109 serving as an interface such as a router or a modem or using a wire or wireless communication medium such as a local area network, the Internet, or a digital satellite broadcast when necessary.

In this specification, steps describing the computer program stored in the program storage medium include not only processing performed in time series according to an order described but also processing executed in parallel or individually, although not always performed in time series.

Embodiments of the invention are not limited to the embodiments described above. Various modifications of the embodiments are possible without departing from the spirit of the invention.

It should be understood by those skilled in the art that various modifications, combinations, sub-combinations, and alterations may occur depending on design requirements and other factors insofar as they are within the scope of the appended claims or the equivalents thereof.

What is claimed is:

1. A demodulating apparatus comprising:
   deinterleave processing means for applying deinterleave processing to supplied data for each of parameters necessary in executing deinterleave processing in a time direction;
   acquiring means for acquiring parameters with which the data should be processed; and
   selecting means for selecting, from the deinterleave processing means, the data subjected to the deinterleave processing with the parameters acquired by the acquiring means.

2. A demodulating apparatus according to claim 1, wherein the parameters are parameters concerning a transmission system.

3. A demodulating apparatus according to claim 1, wherein the deinterleave processing means stops the deinterleave processing performed with parameters other than the parameters acquired by the acquiring means when the selection by the selecting means is performed.

4. A demodulating apparatus comprising:
   a deinterleave processing unit applying deinterleave processing to supplied data for each of parameters necessary in executing deinterleave processing in a time direction;
   an acquiring unit acquiring parameters with which the data should be processed; and
   a selecting unit selecting, from the deinterleave processing unit, the data subjected to the deinterleave processing with the parameters acquired by the acquiring unit.

5. A demodulating apparatus according to claim 4, wherein the parameters are parameters related to a transmission system.

6. A demodulating apparatus according to claim 4, wherein the deinterleave processing unit stops the deinterleave processing performed with parameters other than the parameters acquired by the acquiring means when the selection by the selecting means is performed.

7. A modulating method comprising the steps of:
   performing control for applying deinterleave processing to supplied data for each of parameters necessary in executing deinterleave processing in a time direction;
   acquiring parameters with which the data should be processed; and
   selecting the data subjected to the deinterleave processing with the parameters acquired by processing in the acquiring step from the data for which the deinterleave processing is controlled in the deinterleave processing control step.

8. A non-transitory computer-readable medium tangibly embodied in a storage device encoded with instructions which, when executed on a processor, perform a method, the method comprising:

performing control for applying deinterleave processing to supplied data for each of parameters necessary in executing deinterleave processing in a time direction;

acquiring parameters with which the data should be processed; and selecting the data subjected to the deinterleave processing with the parameters acquired by processing in the acquiring step from the data for which the deinterleave processing is controlled in the deinterleave processing control step.

9. A demodulating apparatus comprising:

storing means for storing supplied data;

flagging means for setting a flag for each of parameters necessary in executing deinterleave processing in a time direction when an amount of data corresponding to the parameters is stored in the storing means;

acquiring means for acquiring parameters with which the data should be processed; and readout means for reading out and outputting, when the parameters are acquired by the acquiring means, the data stored in the storing means in an order corresponding to the parameters different from an order of storing the data if a flag corresponding to the parameters is set by the flagging means and reading out the data stored in the storing means, applying processing corresponding to the parameters to the data, and outputting the data in an order corresponding to the parameters different from the order of storing the data when the flag is set if a flag corresponding to the parameters is not set by the flagging means, wherein the demodulating apparatus performs deinterleave processing in a time direction.

10. A demodulating apparatus according to claim 9, wherein the parameters are parameters concerning a transmission system.

11. A demodulating apparatus comprising:

a storing unit storing supplied data;

a flagging unit setting a flag for each of parameters necessary in executing deinterleave processing in a time direction when an amount of data corresponding to the parameters is stored in the storing unit; an acquiring unit acquiring parameters with which the data should be processed; and a readout unit reading out and outputting, when the parameters are acquired by the acquiring unit, the data stored in the storing unit in an order corresponding to the parameters different from an order of storing the data if a flag corresponding to the parameters is set by the flagging unit and reading out the data stored in the storing unit, applying processing corresponding to the parameters to the data, and outputting the data in an order corresponding to the parameters different from the order of storing the data when the flag is set if a flag corresponding to the parameters is not set by the flagging unit, wherein the demodulating apparatus performs deinterleave processing in a time direction.

12. A demodulating apparatus according to claim 11, wherein the parameters are parameters related to a transmission system.

13. A demodulating method for a demodulating apparatus including storing means for storing supplied data, the demodulating method comprising the steps of:

setting a flag for each of parameters necessary in executing deinterleave processing in a time direction when an amount of data corresponding to the parameters is stored in the storing means;

acquiring parameters with which the data should be processed; and reading out and outputting, when the parameters are acquired by processing in the acquiring step, the data stored in the storing means in an order corresponding to the parameters different from an order of storing the data if a flag corresponding to the parameters is set by processing in the flagging step and reading out the data stored in the storing means, applying processing corresponding to the parameters to the data, and outputting the data in an order corresponding to the parameters different from the order of storing the data when the flag is set if a flag corresponding to the parameters is not set in the flagging step, wherein deinterleave processing in a time direction is performed.

14. A non-transitory computer-readable medium tangibly embodied in a storage device encoded with instructions which, when executed on a processor, perform a method, the method comprising:

setting a flag for each of parameters necessary in executing deinterleave processing in a time direction when an amount of data corresponding to the parameters is stored in the storing means;

acquiring parameters with which the data should be processed; and reading out and outputting, when the parameters are acquired by processing in the acquiring step, the data stored in the storing means in an order corresponding to the parameters different from an order of storing the data if a flag corresponding to the parameters is set by processing in the flagging step and reading out the data stored in the storing means, applying processing corresponding to the parameters to the data, and outputting the data in an order corresponding to the parameters different from the order of storing the data when the flag is set if a flag corresponding to the parameters is not set in the flagging step.

* * * * *